(12) United States Patent
Low et al.

(10) Patent No.: US 10,190,218 B2
(45) Date of Patent: Jan. 29, 2019

(54) INTEGRATED CIRCUIT SUBSTRATE CONTAINING PHOTOIMAGEABLE DIELECTRIC MATERIAL AND METHOD OF PRODUCING THEREOF

(71) Applicant: Twisden Ltd., Tortola (VG)

(72) Inventors: Loke Chew Low, Tortola (VG); Linhui Yuan, Tortola (VG); Poh Cheng Ang, Tortola (VG)

(73) Assignee: TWISDEN LTD., Tortola (VG)

( * ) Notice: Subject to any disclaimer, the term of this patent is extended or adjusted under 35 U.S.C. 154(b) by 0 days.

(21) Appl. No.: 15/878,657

(22) Filed: Jan. 24, 2018

(65) Prior Publication Data
US 2018/0209046 A1   Jul. 26, 2018

(30) Foreign Application Priority Data
Jan. 24, 2017   (MY) .......................... PI 2017700264

(51) Int. Cl.
| | |
|---|---|
| H01L 21/02 | (2006.01) |
| H01L 23/52 | (2006.01) |
| C23C 18/16 | (2006.01) |
| H01L 23/498 | (2006.01) |
| C25D 5/02 | (2006.01) |
| H05K 1/11 | (2006.01) |
| H01L 21/48 | (2006.01) |
| H05K 3/46 | (2006.01) |
| H05K 3/18 | (2006.01) |
| H05K 3/20 | (2006.01) |
| H05K 3/24 | (2006.01) |

(52) U.S. Cl.
CPC ...... *C23C 18/1653* (2013.01); *C23C 18/1607* (2013.01); *C25D 5/022* (2013.01); *H01L 21/486* (2013.01); *H01L 23/49822* (2013.01); *H05K 1/115* (2013.01); *H05K 3/184* (2013.01); *H05K 3/205* (2013.01); *H05K 3/4661* (2013.01); *H05K 3/244* (2013.01); *H05K 2201/0376* (2013.01); *H05K 2201/10378* (2013.01)

(58) Field of Classification Search
CPC ... H01L 23/52; H01L 23/535; H01L 23/5383; H01L 21/0271; H01L 21/0272
See application file for complete search history.

(56) References Cited

U.S. PATENT DOCUMENTS

| | | |
|---|---|---|
| 5,709,979 A | 1/1998 | Casson et al. |
| 2007/0010064 A1 | 1/2007 | Das et al. |

*Primary Examiner* — Jeremy C Norris
(74) *Attorney, Agent, or Firm* — Preston Smirman; Smirman IP Law, PLLC

(57) ABSTRACT

An integrated circuit substrate, and method of production, includes an internal patterned mask layer defined by multiple mask units that are spaced apart by gaps on a partially or completely removable carrier, and an internal conductive trace layer formed by one or more internal conductive traces that are deposited into the gaps of each internal patterned mask layer such that each gap is occupied with an internal conductive trace. The internal patterned mask layer is made of a photoimageable dielectric material that is retained in the integrated circuit substrate. Other embodiments include the formation of permanent or removable external patterned mask layer and external conductive trace layer on the topmost and optionally the bottommost internal patterned mask layer and internal conductive trace layer. The substrate can also include an insulating layer to partially or completely encapsulate the external conductive trace layer upon removal of the external patterned mask layer.

28 Claims, 9 Drawing Sheets

INTEGRATED CIRCUIT SUBSTRATE CONTAINING PHOTOIMAGEABLE DIELECTRIC MATERIAL AND METHOD OF PRODUCING THEREOF

CROSS-REFERENCE TO RELATED APPLICATION

The instant application claims priority to Malaysia Patent Application Ser. No. PI2017700264 filed Jan. 24, 2017, the entire specification of which is expressly incorporated herein by reference.

FIELD OF INVENTION

This disclosure pertains to a substrate of an integrated circuit package that is applied for connecting the integrated circuit package to a printed circuit board.

BACKGROUND OF THE INVENTION

Integrated circuit package serves to provide protection to integrated circuits through encapsulating the integrated circuit die. Connection of the integrated circuit package to a printed circuit requires an integrated circuit substrate which is also part of the integrated circuit package.

Photoimageable dielectric, PID materials are applied in integrated circuit substrates to enhance the performance of the substrate as they possess compatible properties for integrated circuits such as low dielectric constant, low moisture absorption and good compliance to stress. Furthermore, it is also an affordable material and has a less complex manufacturing process. An example of such PID application in integrated circuit substrate is described in prior art U.S. Pat. No. 5,709,979 where the photoimageable dielectric material is utilized as the base dielectric substrate of a printed wiring board. The printed wiring board comprises a conductive layer which is patterned to form a circuit pattern on a first side of the base substrate. After that, at least one aperture in a second side of the base substrate is fabricated by imaging and developing the photoimageable dielectric material. The use of the photoimageable dielectric material in this prior art improves the resolution and registration precision of access apertures and through holes.

The incorporation of photoimagineable dielectric material in a capacitive substrate is also disclosed in prior art US20070010064 where the method of forming the capacitive substrate involves printing the photoimagineable dielectric layer onto a conductor and fabricating thru-holes to couple selected elements within the substrate for forming at least two capacitors as internal elements of the substrate which defines an electrical assembly.

With dissimilar element arrangements, features and functions from the abovementioned prior arts, the present invention is an integrated circuit substrate containing a conductive base that utilizes the photoimageable dielectric material for guiding the deposition of the patterned conductive layer on the base, and contributing to the performance enhancement of the substrate.

SUMMARY OF THE INVENTION

An aspect of this invention is to provide an integrated circuit substrate that utilizes a photoimageable dielectric material as a permanent mask layer for guiding the deposition of at least one patterned conductive layer within the substrate.

Another aspect of this invention is to provide an integrated circuit substrate that employs a photoimageable dielectric material within the substrate which possesses compatible properties for an integrated circuit package.

Still another aspect of this invention is to provide an integrated circuit substrate having a photoimageable dielectric material that allows control of hole openings therethrough with the use of light, thereby improving the accuracy of hole-opening.

Yet another aspect of this invention is to provide an integrated circuit substrate that enables two sides of the substrate to be connected to electronic components by having conductive layers built on the top and bottom sides of the substrate.

Further another aspect of this invention is to provide an integrated circuit substrate with a thin yet strong structure to support itself even when the base of the substrate is removed.

At least one of the preceding aspects is met, in whole or in part, by this invention, in which the preferred embodiment of this invention describes an integrated circuit substrate that comprises at least one internal patterned mask layer defined by multiple mask units that are spaced apart by gaps on a partially or completely removable carrier; and at least one internal conductive trace layer formed by one or more internal conductive traces that are deposited into the gaps of each internal patterned mask layer such that each gap is occupied with an internal conductive trace; wherein the internal patterned mask layer is made of a photoimageable dielectric material that is retained in the integrated circuit substrate.

In accordance with the aforementioned aspects, this invention also relates to a method for producing an integrated circuit substrate comprising the steps of creating at least an internal patterned mask layer defined by multiple mask units that are spaced apart by gaps on a partially or completely removable carrier from an internal mask layer; and depositing at least an internal conductive trace layer formed by one or more internal conductive traces into the gaps of each internal patterned mask layer such that each gap is occupied with an internal conductive trace; wherein the internal patterned mask layer is made of a photoimageable dielectric material that is retained in the integrated circuit substrate.

DETAILED DESCRIPTION OF THE INVENTION

For a better understanding of the invention, preferred embodiments of the invention that are illustrated in the accompanying drawings will be described in detail.

Figure 9:
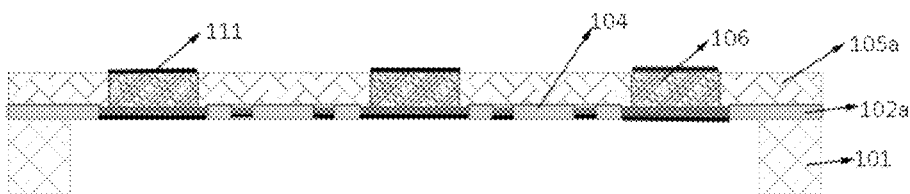
FIG. 9 is a diagram showing the formation of a finishing layer on the exposed top surface of the topmost internal conductive trace layer, and on the exposed bottom surface of the bottommost internal conductive trace layer upon removal of the carrier partially.
Figure 10:
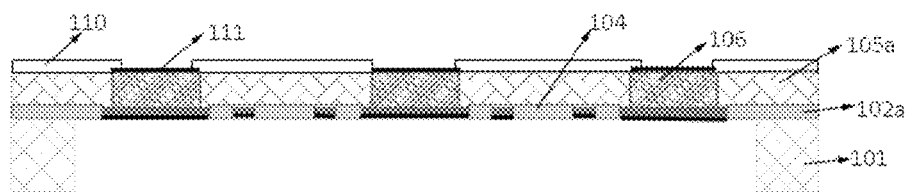
FIG. 10 is a diagram showing the substrate with a partial carrier having an insulating layer disposed on the internal patterned mask layer and partially on the internal conductive trace layer which exposes the top surface of some of the internal conductive trace layers. The insulating layer is formed before the finishing layer is added to the substrate.
Figure 12:
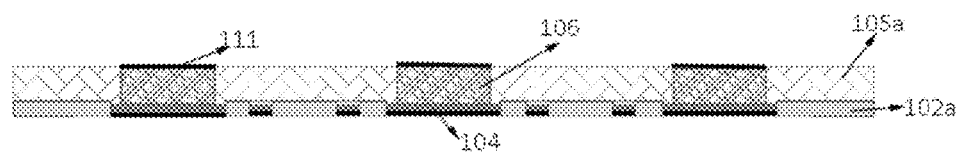
FIG. 12 is a diagram showing the formation of a finishing layer on the exposed top surface of the topmost external conductive trace layer, and on the exposed bottom surface of the bottommost internal conductive trace layer upon removal of the carrier completely.
Figure 13:
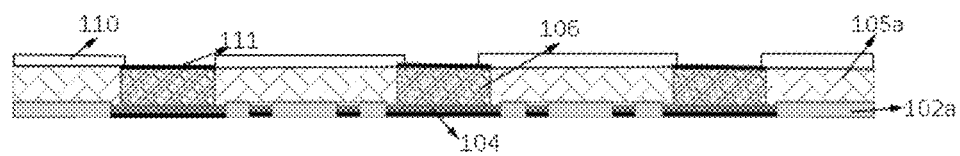
FIG. 13 is a diagram showing the substrate without a carrier having an insulating layer disposed on the internal patterned mask layer and partially on the internal conductive trace layer which exposes the top surface of some of the internal conductive trace layers. The insulating layer is formed before the finishing layer is added to the substrate.
Figure 14:
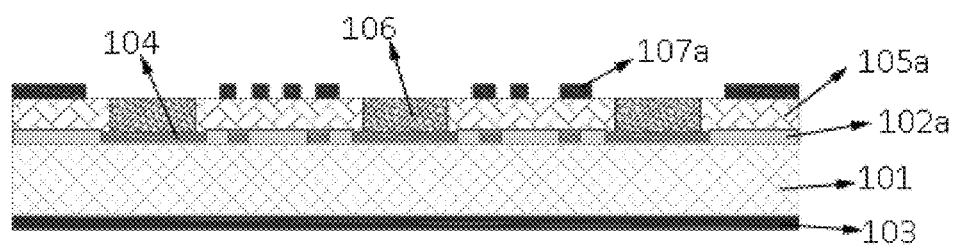
FIG. 14 is a diagram showing the formation of an external patterned mask layer from an external mask layer.
Figure 17:
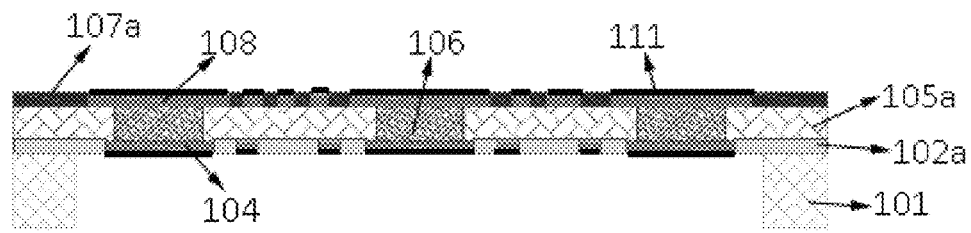
FIG. 17 is a diagram showing the formation of a finishing layer on the exposed top surface of the topmost external conductive trace layer, and on the exposed bottom surface of the bottommost internal conductive trace layer upon removal of the carrier partially for the substrate with internal and external conductive trace layers, and internal and external patterned mask layers.
Figure 19:
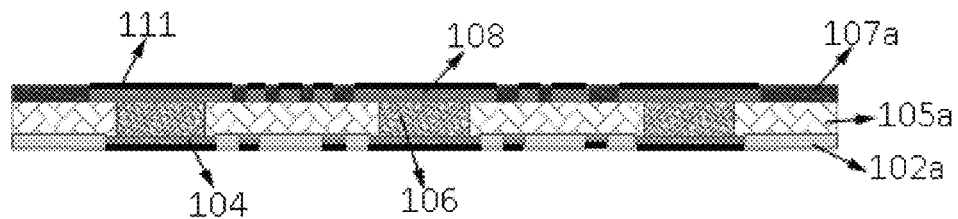
FIG. 19 is a diagram showing the formation of a finishing layer on the exposed top surface of the topmost external conductive trace layer, and on the exposed bottom surface of the bottommost internal conductive trace layer upon removal of the carrier completely for the substrate with internal and external conductive trace layers, and internal and external patterned mask layers.
Figure 30:
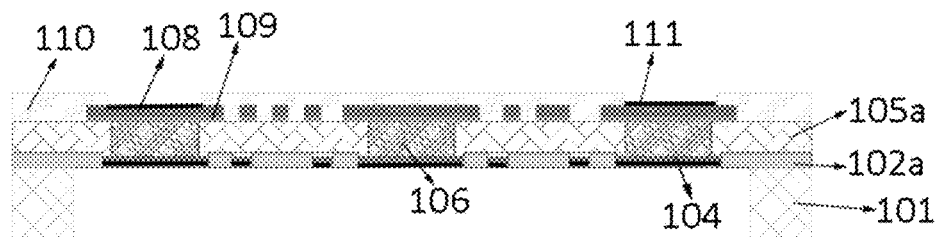
FIG. 30 is a diagram showing the formation of a metal finishing layer on the exposed top surface of the topmost external conductive trace layer and exposed bottom surface of the bottommost internal conductive trace layers of the substrate having its carrier partially removed and an insulating layer partially encapsulating the external conductive trace layer.
Figure 32:
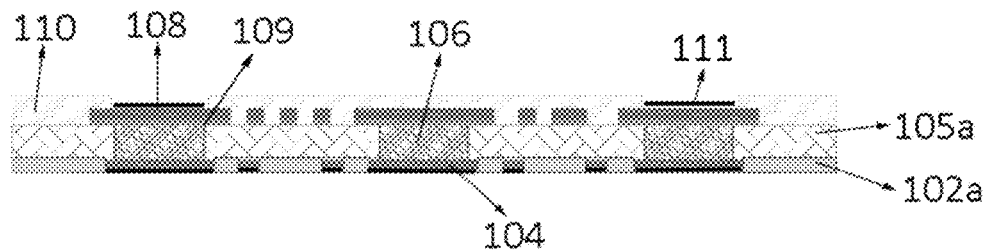
FIG. 32 is a diagram showing the formation of a metal finishing layer on the exposed top surface of the topmost external conductive trace layer and exposed bottom surface of the bottommost internal conductive trace layer of the substrate having its carrier completely removed and an insulating layer partially encapsulating the external conductive trace layer.

The invention described herein is an integrated circuit substrate that is part of an integrated circuit package. The integrated circuit substrate is used for connecting the integrated circuit package to a printed circuit board. FIG. 9, FIG. 10, FIG. 12 and FIG. 13 show four of the preferred embodiments of the invention, whereby the substrate contains two internal conductive trace layers (104, 106) and two internal patterned mask layers (102a, 105a). FIG. 10 and FIG. 13 contain an insulating layer (110) that substantially exposes the topmost internal conductive trace layer. On the other hand, FIG. 17 and FIG. 19 present other preferred embodiments of the invention, in which the substrate comprises both the internal and external conductive trace layers (104, 106, 108), and the internal and external patterned mask layers (102a, 105a, 107a). FIG. 30 and FIG. 32 depict other preferred embodiments of the invention that comprise the internal conductive trace layers (104, 106), external conductive trace layer (108), internal patterned mask layers (102a,

105a) and a insulating layer (110) that completely or partially encapsulates the external conductive trace layer (108).

A general preferred embodiment of the invention comprises at least one internal patterned mask layer (102a, 105a) defined by multiple mask units that are spaced apart by gaps on a partially or completely removable carrier (101), and at least one internal conductive trace layer (104, 106) formed by one or more internal conductive traces that are deposited into the gaps of each internal patterned mask layer (102a, 105a) such that each gap is occupied with an internal conductive trace. The internal conductive trace layers (104, 106) are configured in a manner where the internal conductive trace of an upper internal conductive trace layer is disposed on top of at least one internal conductive trace of a lower internal conductive trace layer. The exposed top surface of topmost internal conductive trace layer, and optionally the exposed bottom surface bottommost internal conductive trace layer when the carrier (101) is partially or completely removed can be added with a finishing layer (111). Examples of such embodiments is shown in FIG. 9 and FIG. 12, where the carrier (101) is partially removed in FIG. 9 and completely removed in FIG. 12.

An insulating layer (110) is disposed on top surface of the topmost internal patterned mask layer and on selected top surface of the topmost internal conductive trace layer. Optionally, the insulating layer (110) can also be disposed on the bottom surface of the bottommost internal patterned mask layer and on selected bottom surface of the bottommost internal conductive trace layer when the carrier (101) is partially or completely removed. The insulating layer (110) completely or partially exposes the top surface of the topmost internal conductive trace layer and/or bottommost internal conductive trace layer. In the exemplary embodiments shown in FIG. 10 and FIG. 13 respectively, the insulating layer (110) partially covers the topmost internal conductive trace layer and exposes most of the top surface of the topmost internal conductive trace layer. The insulating layer (110) is formed on the substrate before depositing the finishing layer (111) on the exposed surfaces of the internal conductive trace layers. The insulating layer (110) can be a solder mask, photoimageable dielectric material, epoxy laminate sheet or polyimide laminate sheet. In order to expose surface of the topmost or bottommost internal conductive trace layer without being entirely covered by the insulating layer (110) that are made of epoxy laminate sheet or polyimide laminate sheet, techniques including grinding, polishing, mechanical trimming, sand blast process or combination thereof can be employed.

Another preferred embodiment of the invention comprises at least an external conductive trace layer (108) formed by one or more external conductive traces that is deposited into gaps of an external patterned mask layer (107a) defined by spaced apart mask units. The external conductive trace layer (108) and external patterned mask layer (107a) are disposed on any one or combination of top surface of topmost internal patterned mask layer, top surface of topmost internal conductive trace layer, as well as bottom surface of the internal patterned mask layer and bottom surface of bottommost internal conductive trace layer when the carrier is partially or completely removed. Such embodiments can be referred in FIG. 17 and FIG. 19, whereby the carrier (101) is partially removed in FIG. 17, and the carrier (101) is completely removed in FIG. 19. A finishing layer (111) can be formed on the exposed top surface of topmost external conductive trace layer, and optionally on the exposed bottom surface of bottommost external conductive trace layer when the carrier (101) is partially or completely removed. If there is no external conductive trace layer (108) at the bottom of the carrier (101), the finishing layer (111) is formed on the exposed bottom surface of the bottommost internal conductive trace layer.

It should be noted that the internal patterned mask layers (102a, 105a) is made of photoimageable dielectric material, whereas the external patterned mask layer (107a) can be either a photoimageable dielectric material that is retained in the substrate or a removable dry film. The internal and external patterned mask layers (102a, 105a, 107a) have a thickness of more than 2 microns. The photoimageable dielectric material possess properties compatible for integrated circuit packages. Preferably, the photoimageable dielectric material is based in sheet, liquid or varnish form that can either be silicone, polyimide (PI), benzocyclobutene (BCB), polybenzoxazole (PBO) or epoxy (EPO). The internal and external conductive trace layers (104, 106, 108), on the other hand, are made of electronically conductive material which is any one or combination of copper, silver, carbon metal and their alloys.

For the embodiments of the invention with the external patterned mask layer (107a) removed, the invention is added with an insulating layer (110) that is formed on top surface of the topmost internal patterned mask layer and on selected top surface of the topmost external conductive trace layer. Besides that, the insulating layer (110) can also be optionally formed on bottom surface of the bottommost internal patterned mask layer and on selected the bottom surface of the bottommost external conductive trace layer when the carrier (101) is partially or completely removed. For substrates with some of the topmost and/or bottommost internal conductive traces not having external conductive traces deposited thereon, the top surface of these topmost conductive traces and/or bottom surface of these bottommost internal conductive traces are also formed with the insulating layer (110). The insulating layer (110) can completely or partially encapsulate the external conductive trace layer (108). For partially encapsulated external conductive trace layer (108), the top surface of the topmost external conductive trace layer and/or bottom surface of the bottommost external conductive trace layer is partially or entirely exposed. As shown in FIG. 30 where the carrier (101) is partially removed and in FIG. 32 where the carrier (101) is completely removed, a finishing layer (111) is formed on the exposed top surface of topmost external conductive trace layer, and on the exposed bottom surface of bottommost internal conductive trace layer. The finishing layer (111) can be formed on the exposed bottom surface bottommost external conductive trace layer instead of the bottommost internal conductive trace layer if there is at least one bottom external conductive trace layer in the substrate.

Figure 1:
FIG. 1 is a diagram showing a carrier.
Figure 2:
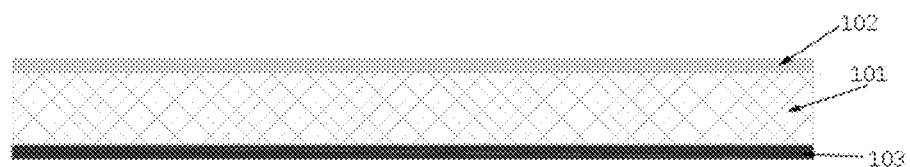
FIG. 2 is a diagram showing the carrier being laminated with a first internal mask layer that is a photoimageable dielectric material on top side of the carrier and a bottom carrier mask layer on bottom side of the carrier.
Figure 3:
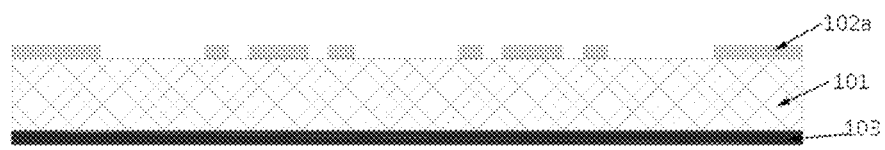
FIG. 3 is a diagram showing the formation of a first internal patterned mask layer from the first internal mask layer.
Figure 4:
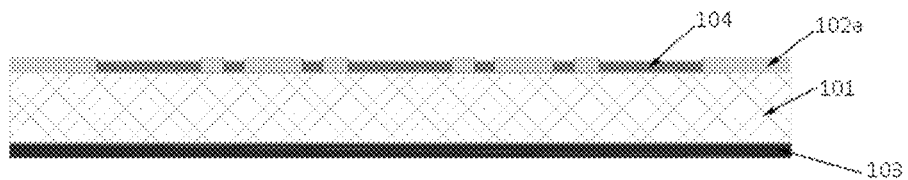
FIG. 4 is a diagram showing the first internal conductive trace layer that is deposited through plating or printing process.

The method for producing the integrated circuit substrate begins with the provision of a carrier (101) that is preferably plated with copper or laminated with a copper foil with bonding sheet at either or both of its top and bottom surfaces as shown in FIG. 1. With reference to FIG. 2, the carrier (101) has a thickness of more than 2 microns. At least one internal mask layer (102) is formed on the top surface of the carrier (101), whereas at least one bottom carrier mask layer (103) being a dry film laminate is formed on the bottom surface of the carrier (101) through dry film lamination process. The bottom carrier mask layer (103) acts as a protective layer to the bottom surface of the carrier (101). FIG. 3 shows the creation of a first internal patterned mask layer (102a) from a first internal mask layer (102). A first internal conductive trace layer (104) formed by one or more internal conductive traces is deposited into the gaps of each first internal patterned mask layer (102a) such that each gap is occupied with an internal conductive trace as illustrated in FIG. 4. Plating or printing of an electronically conductive material is carried out to form the internal conductive trace layers (104, 106).

Figure 5:
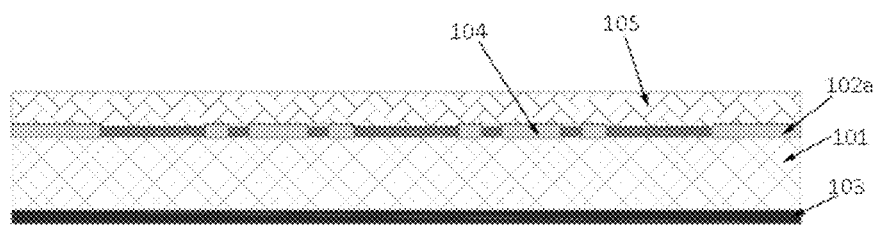
FIG. 5 is a diagram showing the deposition of a second mask layer being a photoimageable dielectric material on top of the first internal patterned mask layer and first internal conductive trace layer.
Figure 6:
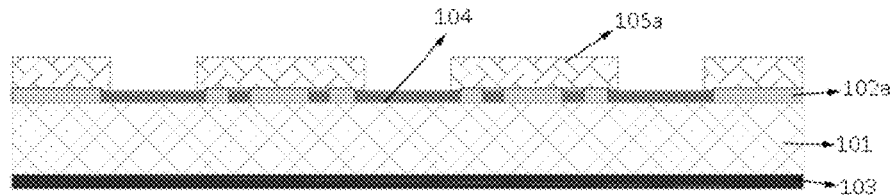
FIG. 6 is a diagram showing the formation of a second internal patterned mask layer from the second internal mask layer.
Figure 7:
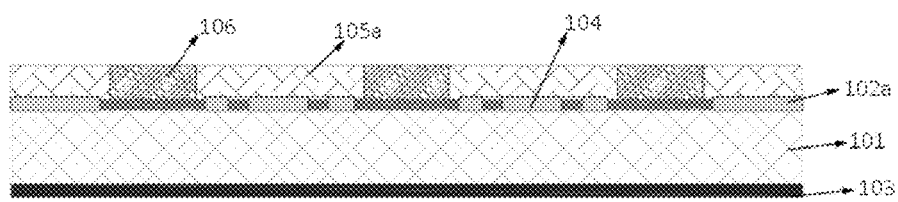
FIG. 7 is a diagram showing the second internal conductive trace layer that is deposited through plating or printing process.
Figure 8:
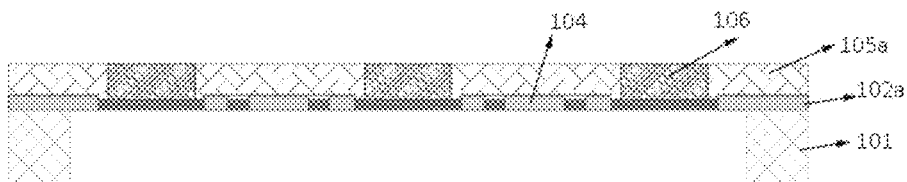
FIG. 8 is a diagram showing the removal of the carrier partially for the substrate with only the internal conductive trace layers.
Figure 11:
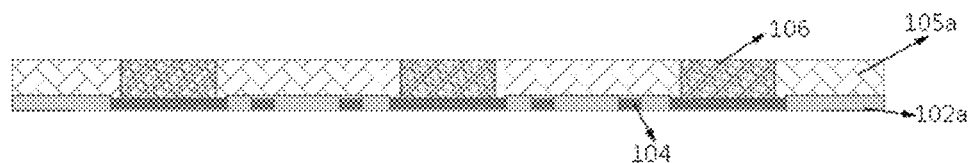
FIG. 11 is a diagram showing the removal of the carrier completely for the substrate with only the internal conductive trace layers.

According to FIG. 5 and FIG. 6, a second internal mask layer (105) is disposed on top of the first internal patterned mask layer (102a) and optionally on the first conductive trace layer (104) before being created as a second internal patterned mask layer (105a). The second conductive trace layer (106) is then deposited into the gaps of the second internal patterned mask layer (105a) through plating or printing of an electronically conductive material. In a preferred embodiment shown in FIG. 7, the second conductive traces are in the form of studs. Grinding or polishing of the topmost internal conductive trace layer is conducted to form a flat surface of the topmost internal conductive trace layer such that it has an even surface as the topmost internal patterned mask layer. The carrier (101) can be partially or completely removed through any one or combination of techniques including chemical release, thermal release, laser release, mechanical release or etching process based on a carrier patterned mask layer created from the bottom carrier mask layer (103) as shown in FIG. 8 and FIG. 11. After that, the finishing layer (111) is disposed on top surface of the topmost internal conductive trace layer, and optionally on bottom surface of bottommost internal conductive trace layer when the carrier (101) is partially or completely removed as depicted in FIG. 9 and FIG. 12. The processes to produce the invention with only the internal conductive trace layers (104, 106) and internal patterned mask layers (102a, 105a) are illustrated in FIG. 1 to FIG. 13.

Prior to the deposition of the finishing layer (111), an insulating layer (110) can be disposed on top surface of the topmost internal patterned mask layer and selectively on top surface of the topmost internal conductive trace layer as shown in FIG. 10 and FIG. 13. Further, the insulating layer (110) can also be disposed on bottom surface of the bottommost internal patterned mask layer and selectively on the bottom surface of the bottommost internal conductive trace layer when the carrier (101) is partially or completely removed. The insulating layer (110) completely or partially exposes the top surface of the topmost internal conductive trace layer and/or bottommost internal conductive trace layer. Only the exposed top surface of the topmost internal conductive trace layer and exposed bottom surface of the bottommost internal conductive trace layer are deposited with the finishing layer (111).

Figure 15:
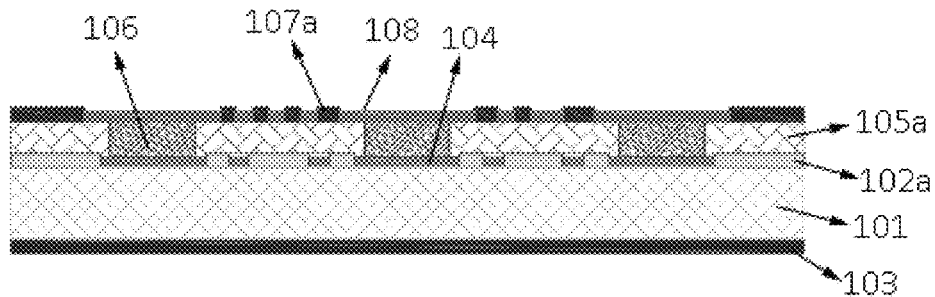
FIG. 15 is a diagram showing the deposition of an external conductive trace layer through an electroless and electroplating or printing process.

In one of the preferred embodiments of the invention, the substrate contains at least one external patterned mask layer (107a) defined by multiple mask units that are spaced apart by gaps which is developed from an external mask layer (107) on top surface of topmost internal patterned mask layer and optionally on top surface of topmost internal conductive trace layer. Besides that, the external patterned mask layer (107a) can also be formed on bottom surface of bottommost internal patterned mask layer and optionally on bottom surface of the bottommost internal conductive trace layer when the carrier (101) is partially or completely removed. The external patterned mask layer (107a) formed of dry film is removable, whereas the external patterned mask layer (107a) made of photoimageable dielectric material as shown in FIG. 14 to FIG. 19 is permanent and is not removed upon deposition of the external conductive trace layer (108) that is formed by one or more external conductive traces into the gaps of the external patterned mask layer (107a) as illustrated in FIG. 15. The photoimageable dielectric materials applied as internal patterned mask layer (102a, 105a), external patterned mask layer (107a) and insulating layer (110) are deposited by lamination process if the photoimageable dielectric material, solder mask or epoxy laminate or polyimide laminate is in sheet form; or by spin-on, spraying, coating, or printing process if the photoimageable dielectric material is in liquid or varnish form.

Figure 16:
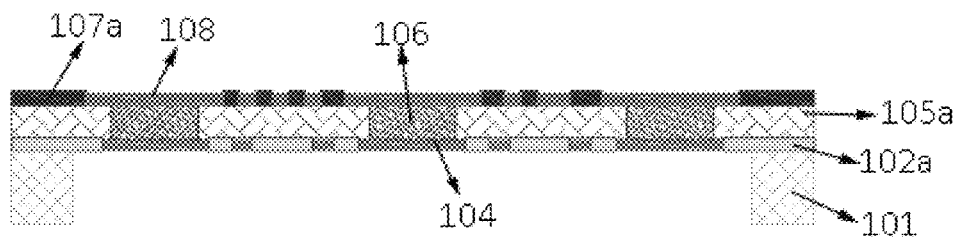
FIG. 16 is a diagram showing the removal of the carrier partially for the substrate with internal and external conductive trace layers, and internal and external patterned mask layers.
Figure 18:
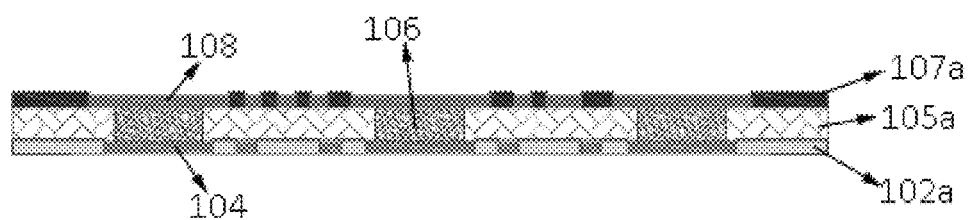
FIG. 18 is a diagram showing the removal of the carrier completely for the substrate with internal and external conductive trace layers, and internal and external patterned mask layers.

Deposition of the external conductive trace layer (108) can be performed via electroless and electroplating, or printing of an electronically conductive material. A conductive seed layer (109) formed by desmear and electroless plating process is developed on topmost internal patterned mask layer and topmost internal conductive trace layer, and optionally on bottommost internal patterned mask layer and bottommost internal conductive trace layer when the carrier (101) is partially or completely removed before the external mask layer (107) is disposed for preparing a surface for electroplating to be conducted thereon to deposit the external conductive trace layer (108). However, if printing is conducted to deposit the external conductive trace layer (108) instead of electroless and electroplating, the conductive seed layer (109) is not required. Grinding, polishing or mechanical trimming of the topmost external conductive trace layer is performed such that the topmost external conductive trace layer has a flat and even surface as the topmost external patterned mask layer. FIG. 16 and FIG. 18 show the substrate of this embodiment with a partial carrier (101) and without a carrier (101) respectively. A finishing layer (111) is disposed on the exposed top surface of the topmost external conductive trace layer and exposed bottom surface of the bottommost internal conductive trace layer in FIG. 17 and FIG. 19. The processes to produce this embodiment of the invention where there are internal and external conductive trace layers (104, 106, 108), and internal and external patterned mask layers (102a, 105a, 107a) are shown in FIG. 1 to FIG. 9, FIG. 11 to FIG. 12 and FIG. 14 to FIG. 19. It should be noted that the conductive seed layer (109) is not shown in FIG. 14 to FIG. 19 for substrates with external conductive trace layer (108) that are deposited via electroless and electroplating.

Figure 20:
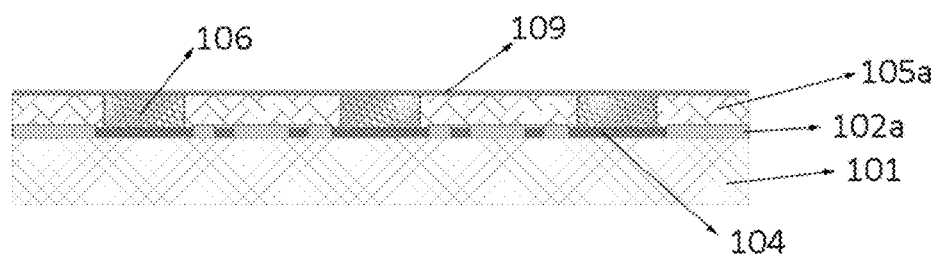
FIG. 20 is a diagram showing the formation of a conductive seed layer through a desmear and electroless plating process before the formation of the external mask layer.
Figure 21:
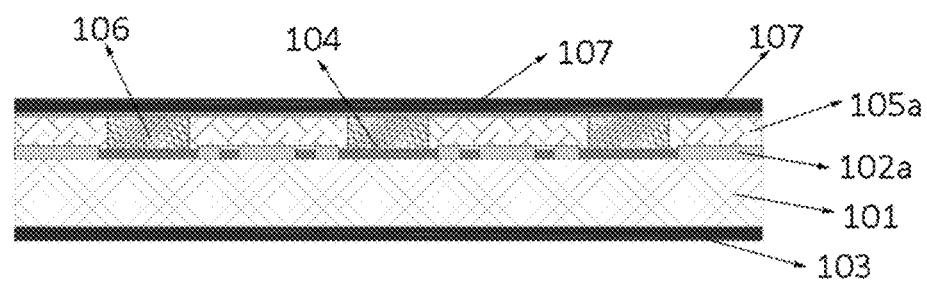
FIG. 21 is a diagram showing the formation of an external mask layer on the conductive seed layer.
Figure 22:
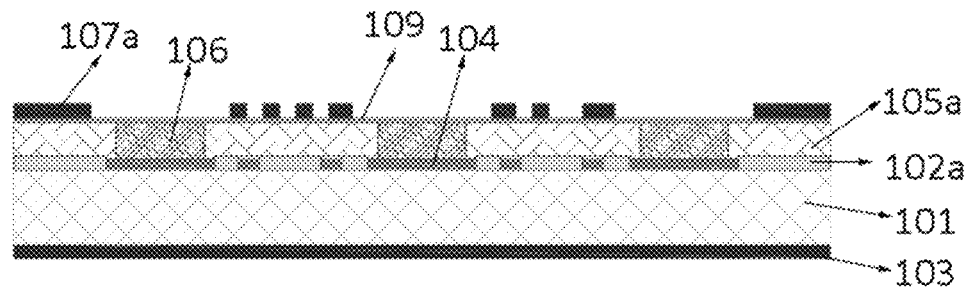
FIG. 22 is a diagram showing the creation of an external patterned mask layer from the external mask layer.
Figure 23:
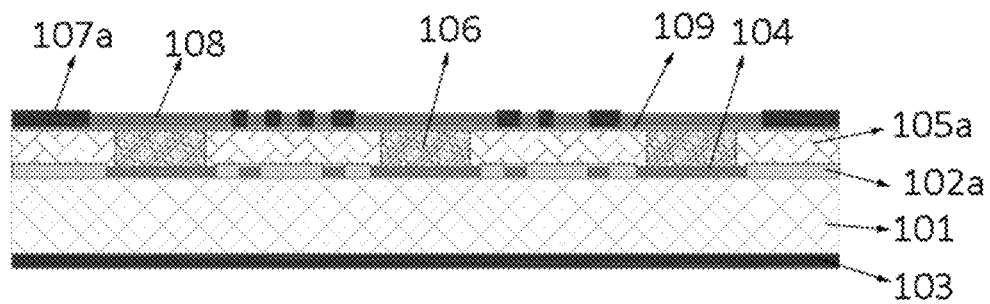
FIG. 23 is a diagram showing the deposition of the external conductive trace layer through electroplating process.
Figure 24:
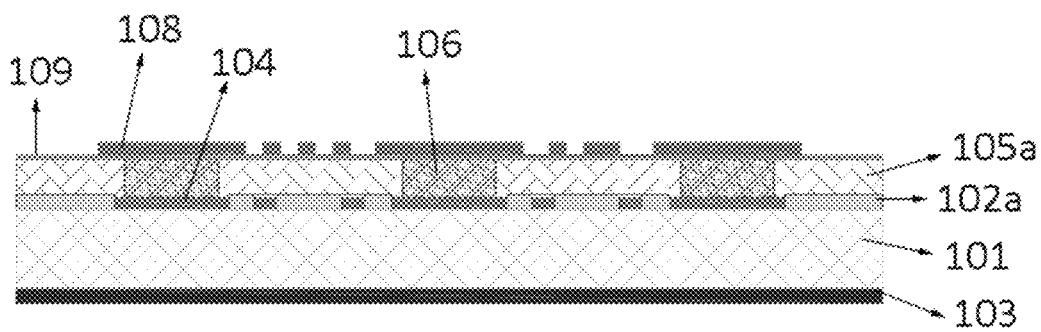
FIG. 24 is a diagram showing the removal of the external patterned mask layer.
Figure 25:
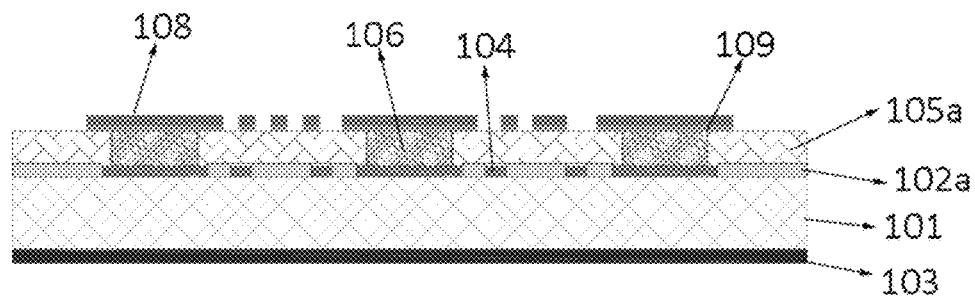
FIG. 25 is a diagram showing the removal of excessive portion of the conductive seed layer.
Figure 26:
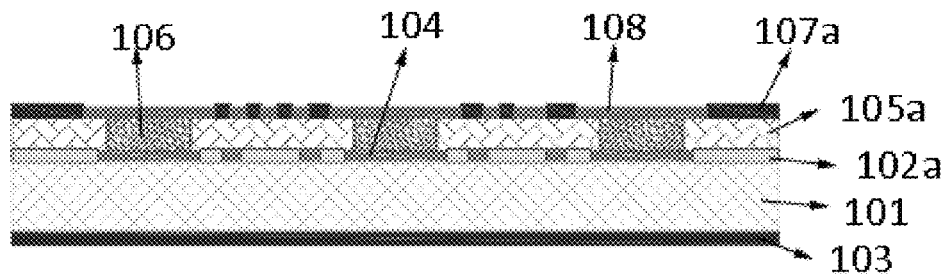
FIG. 26 is a diagram showing the external patterned mask layer and external conductive trace layer that is deposited via printing without requiring the conductive seed layer.

In another preferred embodiment of the invention where the external patterned mask layer (107a) being a dry film is not retained after the external conductive trace layer (108) is deposited, an insulating layer (110) is added in the substrate. The process to produce this embodiment of the invention is shown in FIG. 1 to FIG. 9, FIG. 11 to FIG. 12, FIG. 20 to FIG. 32. Upon producing the substrate with the internal patterned mask layer (102a, 105a) and internal conductive trace layer (104, 106), a conductive seed layer (109) is developed through desmear and electroless plating process on topmost internal patterned mask layer and selectively on internal conductive trace layer. Optionally, the conductive seed layer (109) can also be formed on bottommost internal patterned mask layer and on selected bottommost internal conductive trace layer (109) when the carrier (101) is partially or completely removed. Processes including spraying, sputtering deposition, coating, printing, electroless plating or mechanical methods enable the conductive seed layer (109) to be deposited. The conductive seed layer (109) as shown in FIG. 20 serves to prepare a surface for electroplating to be conducted on the topmost internal patterned mask layer. Referring to FIG. 21, the external mask layer (107) is then formed on the conductive seed layer (109). The external patterned mask layer (107a) is created from the external mask layer (107) as presented in FIG. 22. After that, an external conductive trace layer (108) is deposited into the gaps of the external patterned mask layer (107a). The external patterned mask layer (107a) is removed, preferably through a dry film stripping process. Excessive portions of the conductive seed layer (109) that are not deposited with any external conductive traces thereon after the deposition of the external conductive trace layer (108) is also removed as shown in FIG. 25 through etching process. On the other hand, if printing is used to deposit the external conductive trace layer (108) instead of the electroless and electroplating process, the conductive seed layer (109) is not needed before disposing the external mask layer (107) as shown in FIG. 26. The following steps shown in FIG. 27 to FIG. 32 apply to substrate with the external conductive trace layer (108) that is deposited via printing, but the conductive seed layer (109) is not shown in the substrate illustrated in FIG. 27 to FIG. 32 since it is not needed.

Figure 27:
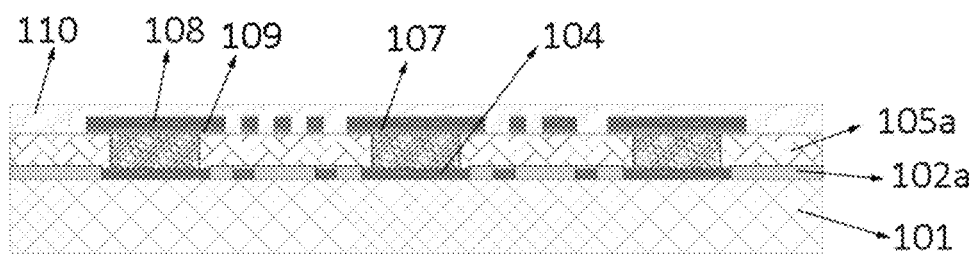
FIG. 27 is a diagram showing the deposition of an insulating layer formed on top surface of the topmost internal patterned mask layer and partially on top surface of the topmost internal conductive trace layer.
Figure 28:
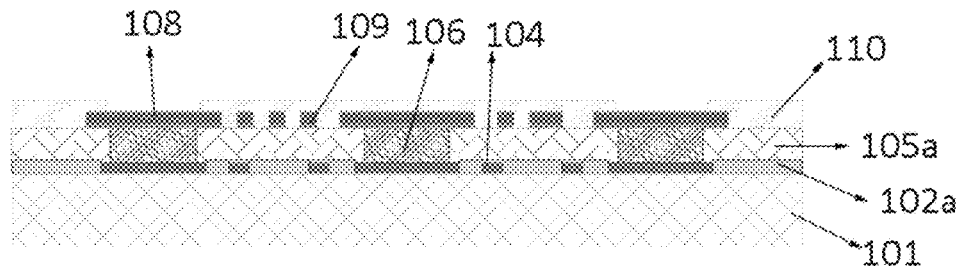
FIG. 28 is a diagram showing the removal of unwanted insulating layer to expose the top surface of some of the external conductive trace layers.
Figure 29:
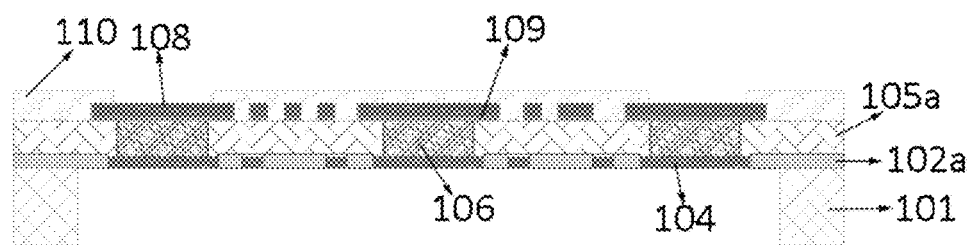
FIG. 29 is a diagram showing the removal of the carrier partially for the substrate having internal conductive trace layers, external conductive trace layer and insulating layer for partially encapsulating the external conductive trace layer.
Figure 31:
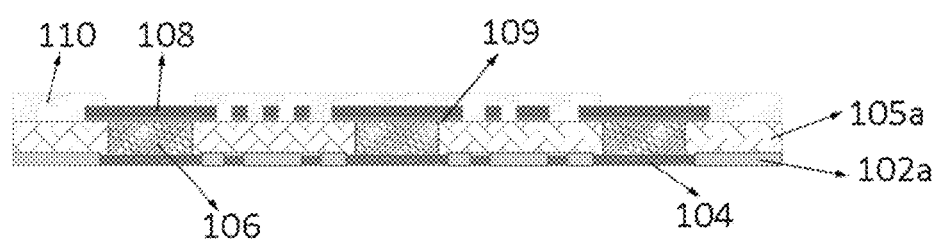
FIG. 31 is a diagram showing the removal of the carrier completely for the substrate with internal conductive trace layers, external conductive trace layer and insulating layer for partially encapsulating the external conductive trace layer.

Referring to FIG. 27, an insulating layer (110) is then formed on top surface of the topmost internal patterned mask layer and selectively on the top surface of the topmost external conductive trace layer. The insulating layer (110) can also be optionally formed on bottom surface of the bottommost internal patterned mask layer and the bottom surface of the bottommost external conductive trace layer when the carrier (101) is partially or completely removed. For substrates with some of the topmost and/or bottommost internal conductive traces not having external conductive traces deposited thereon, the top surface of these topmost conductive traces and/or bottom surface of these bottommost internal conductive traces are also formed with the insulating layer (110). The insulating layer (110) can completely or partially encapsulate the external conductive trace layer (108). In FIG. 28, portions of the insulating layer (110) that are on top of some of the topmost external conductive trace layer are removed to expose the top surface of the topmost external conductive trace layer. Patterning on the bottom carrier mask layer (103) to form a patterned bottom carrier mask layer is conducted to determine the portions of the carrier (101) to be removed. FIG. 29 shows the substrate of this embodiment with a partial carrier (101) whereas FIG. 31 shows the substrate without a carrier (101). A finishing layer (111) is formed on the exposed top surface of the topmost external conductive trace layer, and on the exposed bottom surface of the bottommost internal conductive trace layer in the substrate with a partial carrier (101) as shown in FIG. 30 and in the substrate without any carrier (101) as illustrated in FIG. 32.

What is claimed is:

1. An integrated circuit substrate, comprising:
   at least one internal patterned mask layer defined by multiple mask units that are spaced apart by gaps on a partially or completely removable carrier; and
   at least one internal conductive trace layer formed by one or more internal conductive traces that are deposited into the gaps of each internal patterned mask layer such that each gap is occupied with an internal conductive trace;
   wherein the internal patterned mask layer is made of a photoimageable dielectric material that is retained in the integrated circuit substrate.

2. The integrated circuit substrate according to claim 1, wherein the internal conductive trace layers are configured in a manner where the internal conductive trace of an upper internal conductive trace layer is disposed on top of at least one internal conductive trace of a lower internal conductive trace layer.

3. The integrated circuit substrate according to claim 1, further comprising an insulating layer on top surface of the topmost internal patterned mask layer and selected top surface of the topmost internal conductive trace layer, and optionally on bottom surface of the bottommost internal patterned mask layer and selected bottom surface of the bottommost internal conductive trace layer when the carrier is partially or completely removed, wherein the insulating layer completely or partially exposes the top surface of the topmost internal conductive trace layer and/or bottommost internal conductive trace layer.

4. The integrated circuit substrate according to claim 1, further comprising a finishing layer formed on exposed top surface of topmost internal conductive trace layer, and optionally on exposed bottom surface of bottommost internal conductive trace layer when the carrier is partially or completely removed.

5. The integrated circuit substrate according to claim 1, further comprising at least one external patterned mask layers defined by spaced apart mask units from an external mask layer which is disposed on top surface of topmost internal patterned mask layer and selected top surface of topmost internal conductive trace layer, and optionally on bottom surface of the internal patterned mask layer and selected bottom surface of bottommost internal conductive trace layer when the carrier is partially or completely removed.

6. The integrated circuit substrate according to claim 5, wherein the external patterned mask layer is a removable dry film or a photoimageable dielectric material that is retained in the substrate.

7. The integrated circuit substrate according to claim 5, further comprising at least one external conductive trace layer formed by one or more external conductive traces that is deposited into gaps of the external patterned mask layer on any one or combination of top surface of topmost internal patterned mask layer, top surface of topmost internal conductive trace layer, bottom surface of the internal patterned mask layer and bottom surface of bottommost internal conductive trace layer when the carrier is partially or completely removed.

8. The integrated circuit substrate according to claim 7, further comprising an insulating layer that is formed upon removal of the external patterned mask layer being a dry film on top surface of the topmost internal patterned mask layer, top surface of the topmost internal conductive traces without external conductive traces deposited thereon, and selected top surface of the topmost external conductive trace layer, and optionally on bottom surface of the bottommost internal patterned mask layer, bottom surface of the bottommost internal conductive traces without external conductive traces deposited thereon, and on selected bottom surface of the bottommost external conductive trace layer when the carrier is partially or completely removed, wherein the insulating layer completely or partially encapsulates the external conductive trace layer.

9. The integrated circuit substrate according to claim 8, further comprising a finishing layer formed on exposed top surface of topmost external conductive trace layer, and optionally on exposed bottom surface of bottommost external conductive trace layer when the carrier is partially or completely removed.

10. The integrated circuit substrate according to claim 8, wherein the insulating layer is a solder mask, photoimageable dielectric material, epoxy laminate sheet or polyimide laminate sheet.

11. The integrated circuit substrate according to claim 10, wherein the photoimageable dielectric material is silicone, polyimide, benzocyclobutene, polybenzoxazole, or epoxy, that is based in sheet, liquid or varnish form.

12. A method for producing an integrated circuit substrate, comprising the steps of:
creating at least one internal patterned mask layer defined by multiple mask units that are spaced apart by gaps on a partially or completely removable carrier from an internal mask layer; and
depositing at least one internal conductive trace layer formed by one or more internal conductive traces into the gaps of each internal patterned mask layer such that each gap is occupied with an internal conductive trace;
wherein the internal patterned mask layer is made of a photoimageable dielectric material that is retained in the integrated circuit substrate.

13. The method according to claim 12, further comprising the step of disposing the internal mask layer on top surface of the carrier and a bottom carrier mask layer on bottom surface of the carrier before the step of creating the internal patterned mask layer.

14. The method according to claim 12, wherein the carrier is removed through any one or combination of chemical release, thermal release, laser release, mechanical release or etching process based on a carrier patterned mask layer created from the bottom carrier mask layer.

15. The method according to claim 12, wherein the integrated circuit substrate comprises at least a first internal conductive trace layer and a second internal conductive trace layer where the first internal conductive trace layer is deposited into the gaps of a first internal patterned mask layer, and the second internal conductive trace layer is deposited into the gaps of a second internal patterned mask layer that is disposed on the first internal patterned mask and optionally on the first internal conductive trace layer.

16. The method according to claim 12, wherein the internal conductive trace layer is deposited through plating or printing of an electronically conductive material.

17. The method according to claim 12, further comprising the step of depositing an insulating layer on top surface of the topmost internal patterned mask layer and selected top surface of the topmost internal conductive trace layer, and optionally on bottom surface of the bottommost internal patterned mask layer and selected bottom surface of the bottommost internal conductive trace layer when the carrier is partially or completely removed, wherein the insulating layer completely or partially exposes the top surface of the topmost internal conductive trace layer and/or bottommost internal conductive trace layer.

18. The method according to claim 12, further comprising the step of forming a finishing layer on exposed top surface of topmost internal conductive trace layer, and optionally on exposed bottom surface of bottommost internal conductive trace layer when the carrier is partially or completely removed.

19. The method according to claim 12, further comprising the step of creating at least an external patterned mask layer being either a removable dry film or a photoimageable dielectric material that is retained in the substrate, the external patterned mask layer is defined by multiple mask units that are spaced apart by gaps from an external mask layer on top surface of topmost internal patterned mask layer and selected top surface of topmost internal conductive trace layer, and optionally on bottom surface of bottommost internal patterned mask layer and selected bottom surface of the bottommost internal conductive trace layer when the carrier is partially or completely removed.

20. The method according to claim 19, further comprising the step of depositing at least an external conductive trace layer formed by one or more external conductive traces into the gaps of the external patterned mask layer on any one or combination of top surface of topmost internal patterned mask layer, top surface of topmost internal conductive trace layer, bottom surface of bottommost internal patterned mask layer and bottom surface of the bottommost internal conductive trace layer when the carrier is partially or completely removed.

21. The method according to claim 20, further comprising the step of removing the external patterned mask layer after the deposition of the external conductive trace layer.

22. The method according to claim 21, further comprising the step of forming an insulating layer upon removal of the external patterned conductive trace layer that is a dry film, the insulating layer is formed on top surface of the topmost internal patterned mask layer, top surface of the topmost internal conductive traces without external conductive traces deposited thereon, and selected top surface of the topmost external conductive trace layer, and optionally on bottom surface of the bottommost internal patterned mask layer, bottom surface of the bottommost internal conductive traces without external conducitve traces deposited thereon and selected bottom surface of the bottommost internal conductive trace layer when the carrier is partially or completely removed, wherein the insulating layer completely or partially encapsulates the external conductive trace layer.

23. The method according to claim 20, further comprising the step of forming a finishing layer on exposed top surface of topmost external conductive trace layer, and optionally on exposed bottom surface of bottommost external conductive trace layer when the carrier is partially or completely removed.

24. The method according to claim 20, wherein the external conductive trace layer is deposited through electroless and electroplating or printing of an electronically conductive material.

25. The method according to claim 24, wherein the electroless plating includes the step of depositing a conductive seed layer on topmost internal conductive trace layer, and optionally on bottommost internal conductive trace layer when the carrier is partially or completely removed prior to forming the external patterned mask layer.

26. The method according to claim 25, wherein the conductive seed layer is deposited through spraying, sputtering deposition, coating, printing, electroless plating or mechanical processes.

27. The method according to claim 25, wherein the conductive seed layer is removed through an etching process upon deposition of the external conductive trace layer.

28. The method according to claim 12, wherein the photoimageable dielectric material is deposited by lamination process if the photoimageable dielectric material is in sheet form, or by spin-on, spraying, coating, or printing process if the photoimageable dielectric material is in liquid or varnish form.

* * * * *